(12) United States Patent
Francis et al.

(10) Patent No.: US 6,350,393 B2
(45) Date of Patent: *Feb. 26, 2002

(54) USE OF CSOH IN A DIELECTRIC CMP SLURRY

(75) Inventors: Alicia F. Francis, Naperville; Brian L. Mueller, Aurora; James A. Dirksen, Oswego; Paul M. Feeney, Aurora, all of IL (US)

(73) Assignee: Cabot Microelectronics Corporation, Aurora, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,965

(22) Filed: Nov. 4, 1999

(51) Int. Cl.$^7$ ................................................ C09K 13/00
(52) U.S. Cl. ...................................... 252/79.1; 252/79.5
(58) Field of Search ............................. 252/79.1, 79.5, 252/79.2; 438/692, 693, 745, 690, 691

(56) References Cited

U.S. PATENT DOCUMENTS

| 4,150,171 A | 4/1979 | Feldstein |
| 4,440,670 A | 4/1984 | Horowitz et al. |
| 4,983,650 A * | 1/1991 | Sasaki .......................... 524/27 |
| 5,129,982 A | 7/1992 | Wang et al. |
| 5,352,277 A | 10/1994 | Sasaki |
| 5,525,191 A * | 6/1996 | Maniar et al. ............... 438/693 |
| 5,714,418 A * | 2/1998 | Bai et al. ..................... 438/627 |
| 5,733,819 A * | 3/1998 | Kodama et al. ............. 438/692 |
| 5,752,875 A * | 5/1998 | Ronay .......................... 451/41 |
| 5,769,689 A * | 6/1998 | Cossaboon et al. ........... 451/41 |

OTHER PUBLICATIONS

Fishbein, et al., "Characterization of cesium diffusion in silicon dioxide films using backscattering spectrometry", *Appl. Phys. Lett.*, 50: 1200–1202 (1987).

Sixt, et al., "Control of Positive Surface Charge in Si–SiO$_2$ Interfaces by Use of Implanted Cs Ions", *Applied Physics Letters*, 19: 478–479 (1971).

Abstract of Invention entitled Polishing Slurry.

* cited by examiner

*Primary Examiner*—Benjamin L. Utech
*Assistant Examiner*—Binh X. Tran

(57) ABSTRACT

Chemical mechanical polishing compositions including an abrasive and cesium hydroxide and methods for polishing dielectric layers associated with integrated circuits using cesium hydroxide containing polishing compositions.

10 Claims, 3 Drawing Sheets

USE OF CSOH IN A DIELECTRIC CMP SLURRY

BACKGROUND OF THE INVENTION (1) Field of the Invention

This invention concerns chemical mechanical polishing compositions including an abrasive and cesium hydroxide. This invention also concerns methods for polishing dielectric layers associated with integrated circuits using cesium hydroxide containing polishing compositions.

(2) Description of the Art

Integrated circuits are made up of millions of active devices formed in or on a silicon substrate. The active devices, which are initially isolated from one another, are interconnected to form functional circuits and components. The devices are interconnected through the use of multilevel interconnections. Interconnection structures normally have a first layer of metallization, an interconnection layer, a second level of metallization, and sometimes a third and subsequent level of metallization. Interlevel dielectrics (ILDs) such as doped and undoped silicon dioxide ($SiO_2$), or low-K dielectrics tantalum nitride are used to electrically isolate the different levels of metallization in a silicon substrate or well.

In typical semiconductor manufacturing processes, metallized vias, metallized layer and interlevel dielectric layers are built-up to create an integrated circuit. As the layers are being built-up, the excess materials are removed and the substrate surfaces are planarized by using chemical mechanical polishing (CMP) techniques. In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution is applied to the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The polishing composition ingredients are an important factor in the success of the CMP step. By carefully selecting ingredients, the polishing composition can be tailored to provide effective polishing to the selected layer at desired polishing rates while minimizing surface imperfections, defects and corrosion and erosion of adjacent layers.

During the manufacture of integrated circuits, dielectric layers, typically including silicon dioxide are applied to the circuit. Once applied, the dielectric layer is generally non-planar and must be polished using a polishing composition to give a planar dielectric surface. It is important that the chosen polishing composition be capable of producing a planarized dielectric surface with few defects. Furthermore, it is important that tie polishing composition chosen be capable of polishing the dielectric layer efficiently and repeatedly. Current ILD slurries are typically stabilized abrasive slurries including about 10–30 wt % abrasives. The stabilizing ion is typically potassium or ammonia where slurries typically have a pH greater than 8. The shortcomings of potassium slurries are ionic contamination from the potassium where the contaminating ions become mobile ions and will detrimentally impact device reliability by migrating to the gate area and lowering the threshold voltage of the transistors. In addition, there is a level of defectivity that is characteristic of silica dispersed with potassium.

Ammonia slurries solve the mobile ion problem associated with potassium stabilized slurries. However, ammonia has a strong odor. In addition, ammonia slurries planarize less effectively, polish with a high level of defectivity and polish with low rates compared to potassium slurries.

As a result, there remains a need for improved polishing compositions that are capable of polishing dielectric layers efficiently to give polished dielectric layers that are essentially planar and that exhibit few defects.

SUMMARY OF THE INVENTION

In one embodiment, this invention is a chemical mechanical polishing composition comprising fumed silica and from about 0.01 to about 5.0 wt % of at least one Cs+ basic salt.

In another embodiment, this invention is a chemical mechanical polishing composition comprising water, from about 1 to about 50 wt % fumed silica, and from about 0.1 to about 2.0 wt % CsOH. The polishing composition planarizes a silicon containing substrate with an open field efficiency of at least 50% and with an array field efficiency of at least 85%.

In yet another embodiment, this invention is a chemical mechanical polishing composition capable of polishing integrated circuits having gate widths less than about 0.25 microns comprising from about 1 to about 50 wt % of a metal oxide abrasive and from about 0.01 to about 5.0 wt % Cs+ basic salt.

In still another embodiment, this invention is a method for planarizing an insulating layer with a polishing composition of this invention. The polishing is achieved by preparing a polishing composition comprising water and CsOH. The polishing composition is then applied to a surface of the substrate being planarized or to the polishing pad. The polishing pad is brought into contact with the surface of the silicon containing substrate layer being planarized, and the pad is moved in relation to the silicon containing substrate surface being planarized. An abrasive is used in conjunction with the polishing composition to facilitate polishing. The abrasive may be associated with the polishing pad or the abrasive may be added to the polishing composition to give a chemical mechanical polishing slurry before the slurry is applied to the substrate or to the polishing pad.

DESCRIPTION OF THE CURRENT EMBODIMENT

Figure 1:
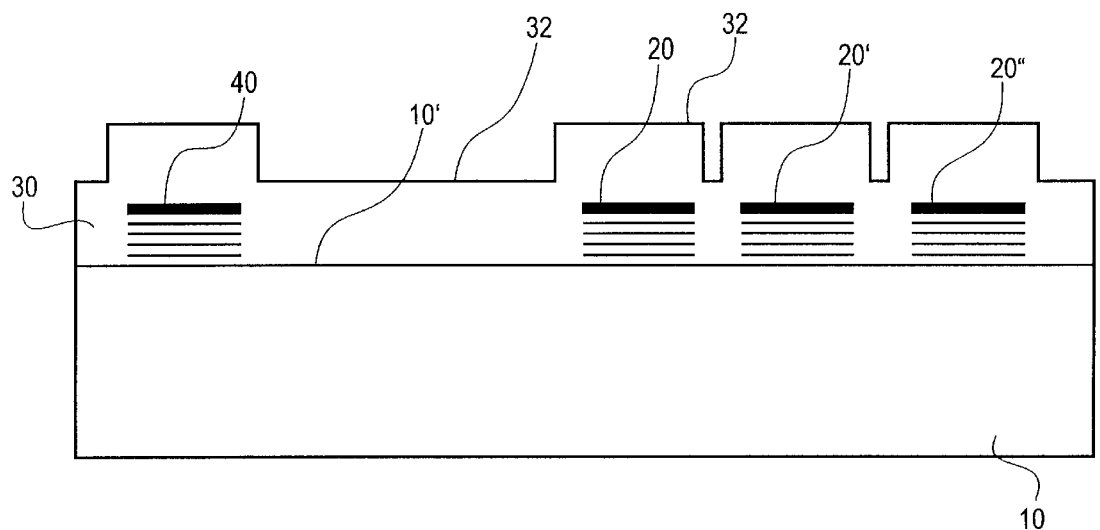
FIG. 1 is a simplified side-cutaway view of a portion of a semiconductor wafer that suitable for planarizing using the compositions and methods of this invention.

The present invention relates to chemical mechanical polishing compositions including an abrasive and at least one Cs+ basic salt such as cesium hydroxide. This invention also concerns methods for polishing dielectric layers associated with integrated circuits using Cs+ basic salt containing polishing compositions.

Basic cesium salt stabilized slurries show an unexpected performance enhancement as compared to ammonia and potassium hydroxide stabilized slurries. Cesium ions have lower mobility than potassium and sodium ions. Furthermore, cesium ion containing polishing compositions polish at higher rates than ammonia slurries and do not have a foul odor like ammonia stabilizes slurries. Also, cesium ion containing polishing compositions polish with lower defectivity as measured as light point defects, and most surprisingly, with improved planarization efficiency in comparison to potassium, sodium and ammonia stabilized slurries.

An important parameter to determine if a semiconductor wafer has been sufficiently planarized is the number of defects remaining in the treated wafer surface following planarization. One type of defect is known in the industry as a "pit" or an undesirable depression in the wafer surface. Another defect is known in the industry as a "dig" or "skid" and represents a series of undesirable coarse scratches that are close together. Another type of defect is a residual slurry particle that cannot be clean off the substrate. The number and type of defects can be determined using art-recognized techniques, including laser light scattering. In general, it is desired to minimize the number of defects.

The polishing compositions of this invention include at least one Cs+ based salt. Examples of Cs+ based salts include but are not limited to cesium formate, cesium acetate, cesium hydroxide, cesium carbonate, cesium bicarbonates, cesium fluoride, cesium chloride, cesium iodide, and mixtures thereof. A preferred Cs+ basic salt is cesium hydroxide (CsOH).

Basic cesium salts such as cesium hydroxide is an important ingredient of the polishing compositions of this invention because cesium acts as a silica stabilizer. Furthermore, the cesium ions do not penetrate into the dielectric layer to the same depth as ammonium or potassium ions resulting in a dielectric layer with few contaminants and with uniform dielectric properties. The overall result is an unexpected improvement is ILD polishing efficiency, defectivity, and an improvement in dielectric layer purity.

The polishing compositions of this invention are aqueous compositions of from about to 0.01 to about 5.0 wt % basic cesium salt. Preferably, the basic cesium salt will be present in aqueous polishing compositions of this invention in an amount ranging from about 0.1 to about 2.0 wt %.

For best results, the pH of the polishing composition of this invention should be greater than about 7.0 and preferably greater than about 9.0.

The polishing compositions of this invention may be combined with at least one abrasive prior to using the composition to polish a substrate layer such as an ILD layer. The abrasive may be added to the aqueous polishing composition to form an aqueous chemical mechanical polishing slurry. Alternatively, the abrasive may be incorporated into a polishing pad during or following the manufacture of the polishing pad. When the abrasive is associated with the polishing pad, the aqueous polishing composition may be applied to a substrate being polished or it may be applied directly to the polishing pad such that the abrasive in the polishing pad and the aqueous polishing composition work in unison to polish the substrate.

The abrasive used in conjunction with the chemical mechanical polishing compositions of this invention are typically metal oxide abrasives. Useful metal oxide abrasives may be selected from the group including alumina, titania, zirconia, germania, silica, ceria and mixtures thereof. The compositions of this invention are preferably used in conjunction with a fumed abrasive.

The fumed abrasive can be any suitable fumed (pyrogenic) metal oxide. Suitable fumed metal oxides include, for example, fumed alumina, fumed silica, fumed titania, fumed ceria, fumed zirconia, and fumed magnesia. Preferably, the fumed metal oxide of the composition of the present invention is fumed silica.

The fumed abrasive and preferably fumed silica may be combined with a second abrasive particles are selected from metal oxides including alumina, silica, titania, ceria, zirconia, and magnesia. Also suitable for use in the composition are colloidal abrasive particles (condensation-polymerized abrasives) prepared in accordance with U.S. Pat. No. 5,230,833 (Romberger et al.) and various commercially available products, such as the Akzo-Nobel Bindzil 50/80 product and the Nalco 1050, 2327, and 2329 products as well as other similar products. Preferably, the second abrasive useful in the compositions and methods of this invention is colloidal silica (condensation-polymerized silica) typically prepared by condensing $Si(OH)_4$ to form colloidal silica particles.

Chemical mechanical polishing slurries of this invention will generally include from about 1.0 to about 50.0 weight percent or more of at least one metal oxide abrasive. It is more preferred, however, that the chemical mechanical polishing slurries of this invention include from about 1.0 to about 30.0 weight percent metal oxide abrasive, and most preferably from about 5.0 to about 25.0 wt % metal oxide abrasive. When a mixture of abrasives are used, it is preferred that the abrasives used in the compositions of this invention include from about 25 to about 60% fumed abrasive and from about 40 to about 75% colloidal abrasive with fumed silica and colloidal silica being preferred.

Other well known additives may be incorporated alone or in combination into the polishing composition of this invention. A non-inclusive list of optional additives includes inorganic acids, organic acids, surfactants, alky ammonium salts or hydroxides, and dispersing agents, additional abrasives, oxidizing agents, complexing agents, film forming agents and so forth.

Dielectric layers such as silicon dioxide, and tantalum nitride are polished with the above described compositions by subjecting the surface to mechanical rubbing (polishing) in the presence of the composition. The rubbing effects mechanical smoothing or wear of the surface which is aided by abrasives in the composition or in the polishing pad, and when present, promoted by the components added to the abrasive to give a chemical mechanical polishing slurry which chemically attacks and dissolves the components comprising the dielectric layer. Polishing may thus be achieved solely by a mechanical mechanism, or by a combination of chemical and mechanical mechanisms.

The mechanical rubbing or polishing is conveniently effected by contacting the dielectric layer with a polishing pad under a predetermined compressive force with relative motion between the pad and the surface. The resulting dynamic friction between the pad and the surface causes the desired wear and smoothing of the disk surface. The relative motion is preferably achieved through rotation of either or both the disk surface and the pad. Commercially available polishing pads that are used to polish glass or wafers in the electronics industry may be used. These pads are typically composed of a microporous polymer such as polyurethane foam, or sintered urethane resin optionally backed with a substrate such as felt, latex filled felt, dense polyurethane, or latex.

As mentioned above, the abrasive may be incorporated into the chemical mechanical polishing composition to form a chemical mechanical polishing slurry or it may be incorporated into the polishing pad. In either instance, the chemical mechanical composition or slurry may be applied to the substrate surface being polished, to the polishing pad, or to both during the polishing process.

We have surprisingly found that the basic cesium salt containing polishing compositions of this invention are able to polish insulating layers, and in particular silicon dioxide dielectric layers at high efficiencies. Specifically, the polishing compositions of this invention are capable of polishing silicon containing substrate layer, and in particular, a silicon dioxide dielectric layer with an open field efficiency of at least 50%. In addition, the polishing compositions of this invention are capable of polishing silicon containing substrate layers, and in particular silicon dioxide containing dielectric layers with an array field efficiency of at least 85%.

We have also learned that the polishing compositions of this invention including basic cesium salts are the first polish compositions that are known to be able to polishing integrated circuit layers with device geometries below about 0.25 microns. The term device geometries refers to average gate width.

FIG. 1 is a simplified view of a representative semiconductor wafer suitable for use with the composition and process according to the invention. For the sake of clarity, well-known features such as doped regions, active devices, epitaxial layers, carrier and field oxide layers. Previously deposited interconnect and previously deposited dielectric films have been omitted. Base 10 represents a semiconductor material such as, but not limited to single crystal silicon, gallium arsenide, and other semiconductor materials known in the art. Base 10 can also represent previous levels of interconnects or gate level dielectric layers.

On the top surface of base 10 are numerous discrete metal interconnects blocks 20 (e.g., metal conductor blocks). Metal interconnect blocks 20 can be made, for example, from aluminum, copper, aluminum copper alloy, tungsten, polysilicon and the like. Metal interconnect blocks are made by typical methods known in the art. An insulating layer 30 is applied over top of metal interconnect blocks and exposed base portions 10'. Insulating layer 30 is typically a metal oxide such as silicon dioxide, BPSG (borophosphosilicate glass), PSG (phosphosilicate glass), or combinations thereof. The resulting insulating layer 30 often has a top surface 32 that has topography and is not as "planar" and/or "uniform" as desired.

Before an additional layer of circuitry can be applied via and patterned photolithography, it is usually necessary to polish top surface 32 of the insulating layer 30 to achieve the desired degree of planarity and/or uniformity. The particular degree of planarity required will depend on many factors, including the individual wafer and the application for which it is intended, as well as the nature of any subsequent processing steps to which the wafer may be subjected. For the sake of simplicity, throughout the remainder of this application this process will be referred to as "planarization" or "polishing".

Figure 2:
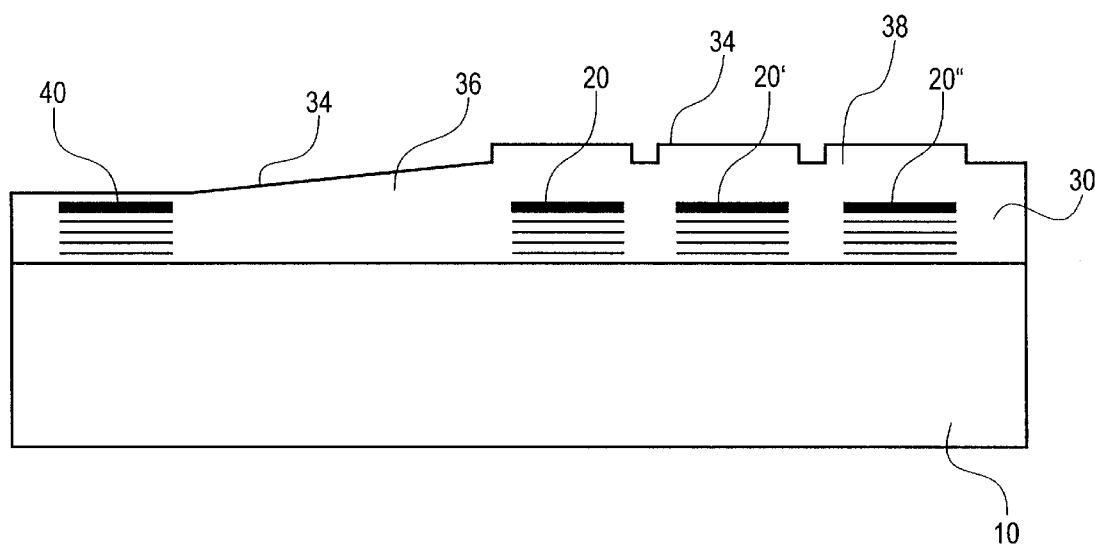
FIG. 2 illustrates the wafer shown in FIG. 1 after polishing.

FIG. 2 illustrates the wafer shown in FIG. 1 after polishing or planarization. As a result of planarization, the polished surface 34 of insulating layer 30 should be sufficiently planar such that when the subsequent photolithography process is used to create a new circuit design, the critical dimension features can be resolved. It should be noted that within a die metal block or device (array) density will vary. Typically, the insulating layer sparse regions 36 will polish at a greater rater than the denser regions 38. In FIGS. 1 and 2 the sparse regions 36 are located above isolated metal block 40 and the denser regions over the densely packed metal interconnect blocks 20, 20', and 20". This planar non-uniformity with the die is referred to as WIDNU (within die non-uniformity).

The magnitude of this type of non-uniformity that can be tolerated in state of the art devices has decreased dramatically as device features (i.e., gate width) shrink below about 0.25 microns. One method of minimizing non-uniformity is to develop slurries and processes that will remove topography, including insulating layers very efficiently but with minimal field loss i.e., loss of insulating layer in sparse regions. Thus a slurry and polishing process that polishes sparse regions slowly will allow the more stringent WIDNU tolerances to be achieved. Two factors drive these more stringent WIDNU tolerances. Both factors are related to smaller and faster computer chips. The first factor is depth of focus considerations during the photolithography step. As the devices shrink to 0.25 micron and below the stepper apertures are smaller making the depths of focus tolerance shallower and making insulating layer thickness uniformly via a global planarity more important. In addition, what limits the performance speed in some state-of-art chips is RC time delays in the backend interconnects. To control RC time delays and to maintain attainable clock speeds constant across the die, improved uniformity of the dielectric insulating layers is required.

Figure 3:
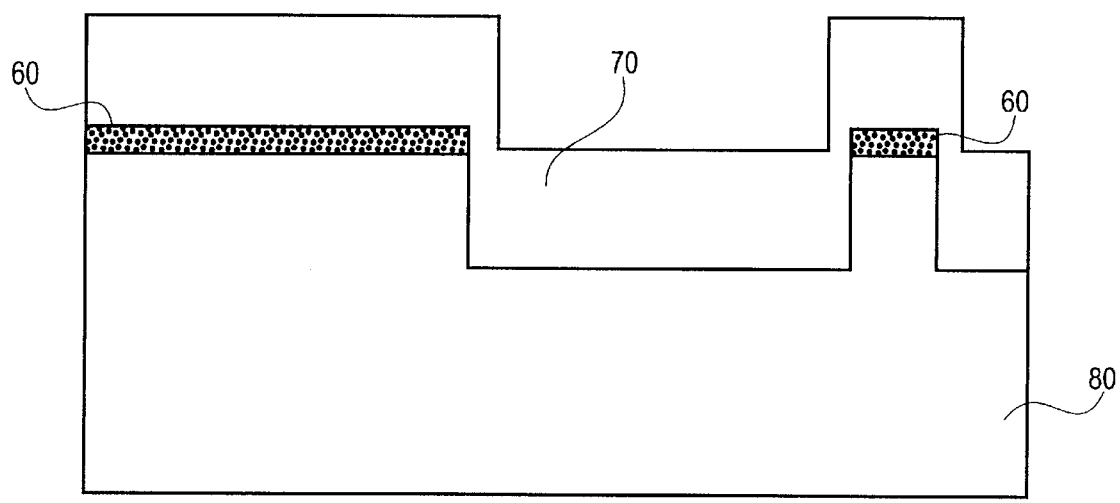
FIG. 3 is a simplified side-cutaway view of a portion of a semiconductor wafer suitable for shallow trench isolation planarization using the compositions and methods of this invention.
Figure 4:
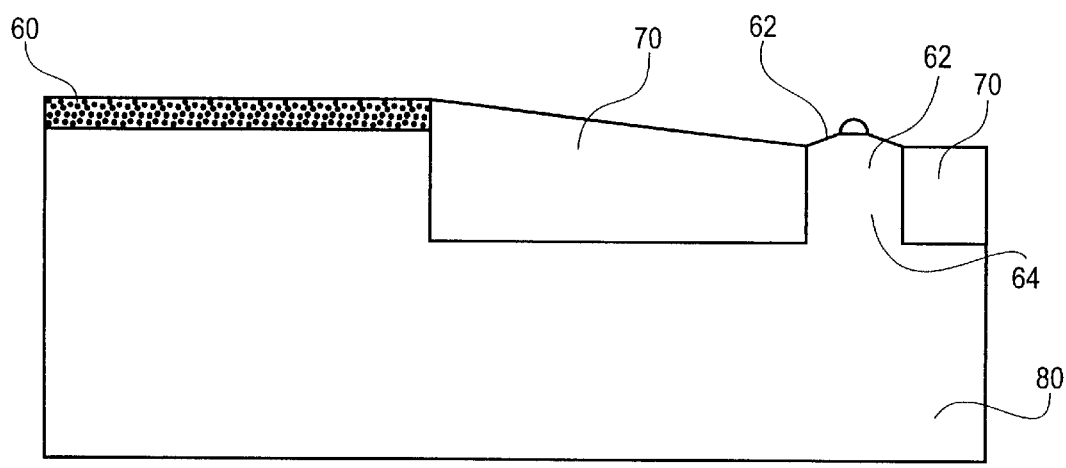
FIG. 4 is the wafer of FIG. 3 including defects that could result due to inefficient planarization.

Shallow trench isolation is another process in which an insulating layer is planarized. Shallow Trench Isolation (STI) is a process step in IC manufacturing to isolate transistors and other devices in integrated circuits. STI has an advantage over other isolation schemes due to improved minimum isolation space, latchup and junction capacitance. FIG. 3 is a simplified view of a representative semiconductor wafer suitable for use with the composition and process according to the invention for direct STI polishing. In direct STI polishing, density effects are also important. Trenches are etched in semiconductor base 80 which is usually single crystal silicon. A hard mask silicon nitride 60 is deposited on the silicon prior to the etching of the trenches. The trenches are then filled with silicon dioxide insulating layer 70. Once again the buildup includes denser and sparse areas. Unlike interlayer dielectric polishing the goal in STI is to polish until the silicon nitride is fully exposed and only silicon oxide remains in the trenches. In FIG. 4 potential detrimental effects of WIDNU are shown where instead of "stopping" on the silicon nitride 60 the silicon nitride is removed to expose bare silicon 62. This catastrophic failure usually occurs by the wear of the corner of the isolated feature 64. One method to reduce the density effects in STI polishing are to use a slurry that has a high selectivity to the field area. Topography is removed at a high rate leaving a "oplanar" surface with a high degree of WIDNU. Subsequent polishing breaks through to the silicon nitride 90 uniformly and minimizes silicon nitride thinning.

As shown in the Examples below, the compositions and methods of this invention are useful for achieving the stringent planarization specifications of present day IC wafers.

EXAMPLE 1

This Example evaluated the ability of polishing compositions including various hydroxide compositions to polish silicon containing substrates at high efficiencies and low defectivity.

The polishing slurry compositions are reported in Table 1, below. Each polishing composition included CAB-O-SPERSE® SC-E fumed silica manufactured by Cabot Corporation. The slurries were stabilized with CsOH or KOH by adding a sufficient amount of each base to each slurry to increase the slurry pH to 10.8. The polishing compositions were used to planarize a test wafer. The test wafers were test patterns of a MIT designed mask where aluminum lines were created on a silicon substrate. The wafers had approximately 9000 angstroms of step height. The patterns were a 250 micron line pitch with systematically varying densities ranging from 100 to 8% where 100% means 100% stack area and 25% means that the lines are thick enough that 25% is stack area and 75% is field area.

Field measurements were taken from two areas of each wafer—the open field and the array field—and the measurements were used in the efficiency calculations. Array field measurements were taken in close proximity to the stack area. Because wide open (or sparse) areas are typically more problematic in real polishing we also evaluated slurry polishing efficiency by measuring the field in the largest open field area or the 8% area and calculating the open field efficiency from the measurement.

Each wafer was planarized using an IPEC 472 polishing machine. The wafers were polished using a down force of 7.5 psi, a back pressure of 3 psi, a platen speed of 37 rpm, a carrier speed of 24 rpm, and a slurry flow rate of 220 ml/min. The wafers were polished for 60, 90, 120 and 150 seconds. Polishing data (step height, stack thickness, field thickness) was collected for each wafer at the fixed polishing intervals (60, 90, 120, and 150 seconds).

There are two ways to measure step height. Step height can be measured directly by a Tencor P20 profilometer or step height can be measured by Tencor Surfscan UV 1050 and calculated by the following equation.

Step height=initial step height−Δstack(initial stack thickness−polished stack thickness)+Δfield(initial field thickness−polished field thickness)

A plot was created for each slurry showing step height vs. time. The curve is fit to the data by interpolating the data along the fitted polishing curve to determine the time at which 95% planarization is achieved (i.e. step height is reduced to 450 Å). Planarization efficiency ($\varepsilon_p$) is calculated at each of the polishing intervals using the following formula:

$$\varepsilon_p = 1 - \frac{\Delta \text{ field thickness}}{\Delta \text{ stack thickness}}$$

The calculated planarization efficiency was then plotted vs. time, and a curve is fit to the data. Taking the efficiency curve and identifying the time at which 95% planarization is achieved, the efficiency at the time required to reach 95% planarization is calculated.

The procedure for calculating the open field efficiency and the array field efficiency are the same. For open field efficiency, the field thickness measurement is at the 8% density region. For array field efficiency, the field thickness measurement is at the 52% density region.

The polishing results, array field efficiencies and open filed efficiencies are reported in Table 1, below.

TABLE 1

| Slurry Composition | Open Field Loss (Å) | Improvement In Field Loss (%) | Open Field Efficiency | Array Field Efficiency |
|---|---|---|---|---|
| 10 wt % Silica; CsOH | 4351 | 19% Reduction | 55.5% | 88.0% |
| 13 wt % Silica; CsOH | 4831 | 10% Reduction | 52.7% | 84.0% |
| 12.5 wt % Silica; KOH | 5374 | | 49.7% | 81.1% |

The polishing results indicate that polishing compositions with cesium hydroxide polish silicon containing substrates at a much higher open field and array filed efficiency that polishing compositions including potassium hydroxide. Specifically, polishing compositions including cesium hydroxide polish silicon containing substrates with a lower filed loss, an improved open field efficiency and an improved array field efficiency.

Open field and array field efficiencies are dependent upon polishing parameters, polishing machine, and other consumables and slurries. For purposes of this application, the term "open field efficiency" and "array field efficiency" refer to the polishing efficiencies determined using an IPEC 472 polishing machine operating at the polishing parameters described above and calculated as described above.

EXAMPLE 2

In this Example, the planarization rate of polishing slurries including CsOH, KOH, and NH$_4$OH were evaluated. Each slurry tested included 12 wt % of CAB-O-SPERSE® SC-E fumed silica manufactured by Cabot Corp. The slurries were stabilized with CsOH, KOH, or NH$_4$OH by adding a sufficient amount of each base to each slurry to increase the slurry pH to 10.8. Each slurry was used to polish a wafer described in Example 1 according to the method described in Example 1.

Figure 5:
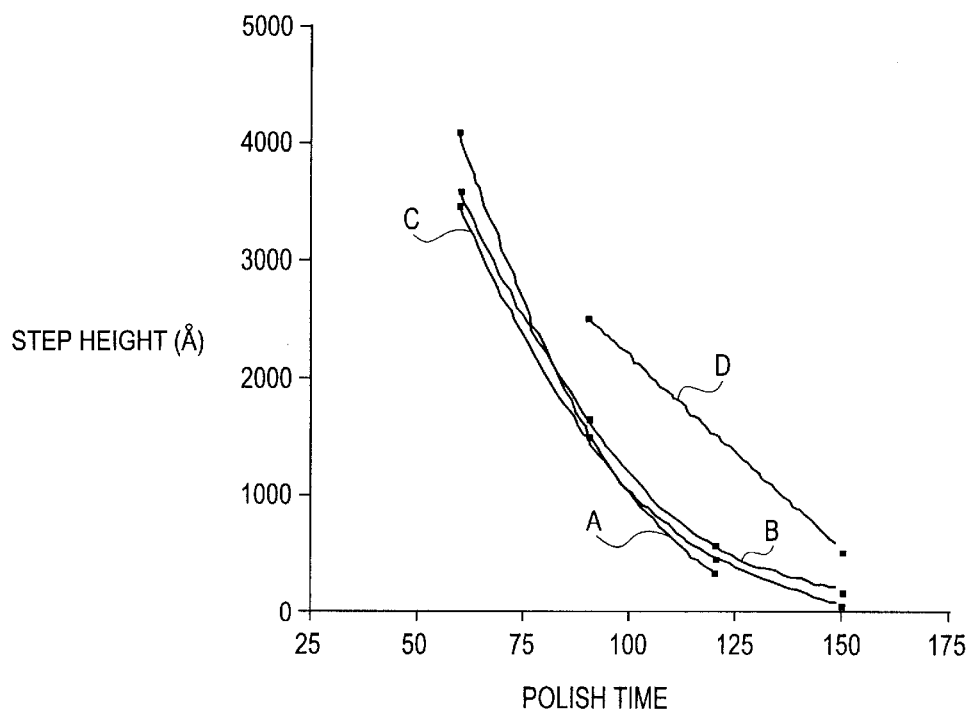
FIG. 5 is a plot of polish time versus step height for CsOH (A & B), KOH, (C) and $NH_4OH$ (D) slurries tested according to the method described in Example 2. The term "polish time" in the plot refers to the time, in seconds, that the substrate is being polished. The term "step height" in the plot refers to the distance from the high points on the topography to the low points during the fabrication of integrated circuits. As devices are built a surface topography is produced and perpetuated through subsequent thin-film depositions. Step height is usually measured in Angstroms.
Figure 6:
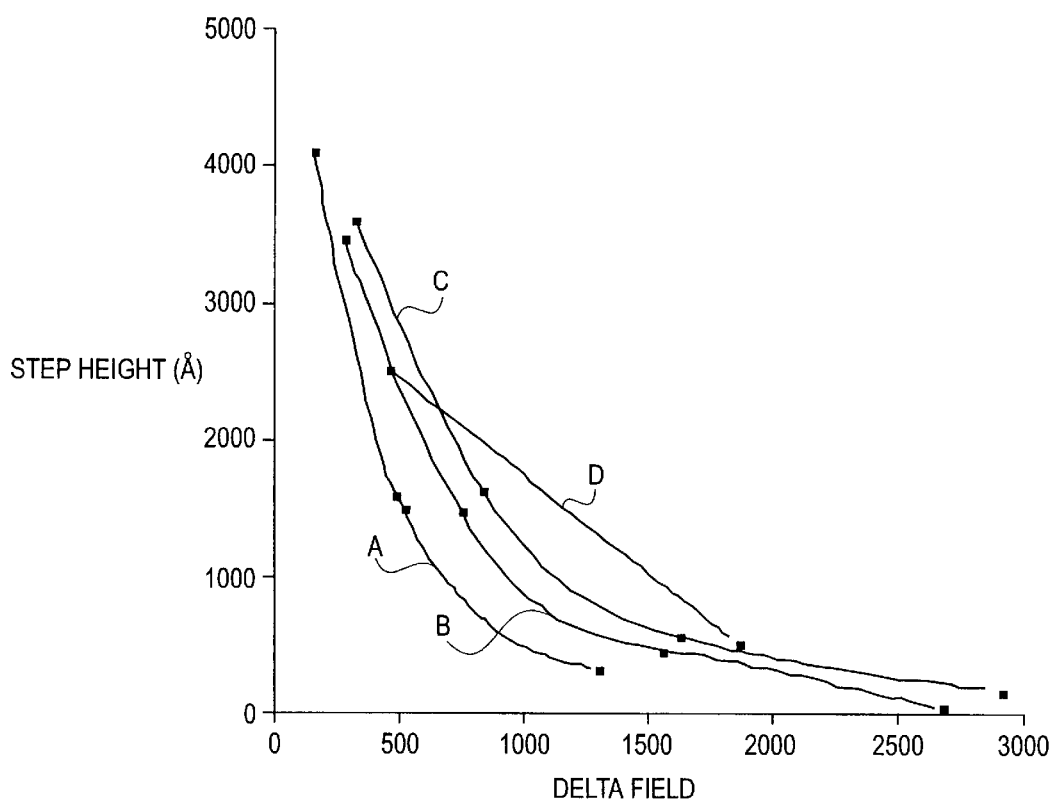
FIG. 6 is a plot of delta field versus step height for slurries tested according to the method of described in Example 2.

The planarization results are represented graphically in FIGS. 5 and 6. According to FIG. 5, the planarization rate of CsOH and KOH slurries are superior to slurries including NH$_4$OH. According to FIG. 6, slurries including CsOH planarize silicon substrates more efficiently than slurries including KOH or NH$_4$OH. The greater efficiency is seen in the delta field improvement over the same step height for CsOH slurries in comparison to KOH and NH$_4$OH slurries.

EXAMPLE 3

This Example evaluated the planarization rate of commercially available polishing slurries. Two slurries were tested. The first slurry D7000, a 10.5 wt % fumed silica dispersion stabilized with KOH. The second slurry was Klebsol 30N50, an 30 wt % ammonia stabilized colloidal silica manufactured by Clariant. Each slurry was used to polish a wafer described in Example 1 according to the polishing method described in Example 1.

The planarization results are reported in Table 2, below.

TABLE 2

| Slurry Composition | Open Field Loss (Å) | Improvement In Field Loss (%) | Open Field Efficiency | Array Field Efficiency |
|---|---|---|---|---|
| D7000 | 5015 | 12.4% reduction | 52.4% | 82.7% |
| 30N50 | 5726 | | 47.6 | 81.4% |

What we claim is:

1. A chemical mechanical polishing composition comprising a fumed abrasive and from about 0.01 to about 5.0 wt % of at least one Cs+ based salt selected from the group consisting of cesium formate, cesium acetate, cesium hydroxide, cesium carbonate, cesium bicarbonates, cesium fluoride, cesium chloride, cesium iodide, and mixtures thereof.

2. The chemical mechanical polishing composition of claim 1 wherein the fumed abrasive is fumed alumina.

3. The chemical mechanical polishing composition of claim 1 wherein the fumed abrasive is from about 1 to about 50 wt % fumed silica.

4. The chemical mechanical polishing composition of claim 1 wherein the polishing composition planarizes a silicon containing substrate with an open field efficiency of at least 50%.

5. The chemical mechanical polishing composition of claim 1 wherein the polishing composition planarizes a silicon containing substrate with an array field efficiency of at least 85%.

6. The chemical mechanical polishing composition of claim 1 including from about 1 to about 20 wt % fumed silica.

7. The chemical mechanical polishing composition of claim 1 wherein the Cs+ basic salt is CsOH.

8. A chemical mechanical polishing composition comprising from about 1 to about 25 wt % fumed silica and from about 0.1 to about 2.0 wt % CsOH.

9. The chemical mechanical polishing composition of claim 1 including a second abrasive.

10. The chemical mechanical polishing composition of claim 9 wherein the second abrasive is colloidal silica.

* * * * *

UNITED STATES PATENT AND TRADEMARK OFFICE
CERTIFICATE OF CORRECTION

PATENT NO. : 6,350,393 B2
DATED : February 26, 2002
INVENTOR(S) : Alicia F. Francis et al.

It is certified that error appears in the above-identified patent and that said Letters Patent is hereby corrected as shown below:

Column 1,
Line 26, the terms "metallized layer" should read -- metallized layers --.
Line 56, the term "tie" should read -- the --.

Column 2,
Line 25, the terms "widths less" should read -- widths of less --.
Line 48, the terms "that suitable" should read -- that is suitable --.

Column 3,
Line 2, the terms "method of described" should read -- method described --.
Line 18, the terms "stablizes slurries." should read -- stabilized slurries --.
Line 32, the terms "clean off" should read -- cleaned off --.
Line 37, the two occurrences of the term "based" should read -- basic --.
Line 44, the terms "Basic cesium salts" should read -- A basic cesium salt --.
Line 51, the terms "is ILD" should read -- in ILD --.
Line 54, the terms "about to 0.01" should read -- about 0.01 --.

Column 4,
Line 21, the terms "particles are selected" should read -- particle selected --.
Line 42, the terms "are used" should read -- is used --.
Line 50, the terms "alky ammonium" should read -- alkyl ammonium --.

Column 5,
Line 20, the term "salt" should read -- salts --.
Line 32, the term "polish" should read -- polishing --.
Line 33, the term "polishing" should read -- polish --.
Line 43, the terms "layers. Previously" should read -- layers previously --.
Line 63, delete the term "and"

Column 6,
Line 14, the term "rater" should read -- rate --.
Line 33, the terms "below the stepper" should read -- below, the steeper --.
Line 37, the terms "of-art" should read -- of-the-art --.
Line 65, the term "are" should read -- is --.
Line 66, the term "oplanar" should read -- planar --.

UNITED STATES PATENT AND TRADEMARK OFFICE
CERTIFICATE OF CORRECTION

PATENT NO.   : 6,350,393 B2
DATED        : February 26, 2002
INVENTOR(S)  : Alicia F. Francis et al.

It is certified that error appears in the above-identified patent and that said Letters Patent is hereby corrected as shown below:

<u>Column 8,</u>
Lines 9, 24 and 28, the terms "filed" should read -- field --.
Line 62, the terms "slurry D7000, a" should read -- slurry, D7000, was a --.
Line 64, the term "an" should read -- a --.

Signed and Sealed this

Fifth Day of August, 2003

JAMES E. ROGAN
*Director of the United States Patent and Trademark Office*